United States Patent
Jaeger et al.

(10) Patent No.: US 9,698,282 B2
(45) Date of Patent: Jul. 4, 2017

(54) OPTOELECTRONIC COMPONENT AND METHOD FOR PRODUCING AN OPTOELECTRONIC COMPONENT

(75) Inventors: Harald Jaeger, Regensburg (DE); Michael Zitzlsperger, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 1121 days.

(21) Appl. No.: 12/933,510

(22) PCT Filed: Mar. 31, 2009

(86) PCT No.: PCT/DE2009/000438
§ 371 (c)(1),
(2), (4) Date: Oct. 21, 2010

(87) PCT Pub. No.: WO2009/143789
PCT Pub. Date: Dec. 3, 2009

(65) Prior Publication Data
US 2011/0074000 A1 Mar. 31, 2011

(30) Foreign Application Priority Data

Apr. 17, 2008 (DE) .................. 10 2008 019 269
May 21, 2008 (DE) .................. 10 2008 024 704

(51) Int. Cl.
*H01L 21/60* (2006.01)
*H01L 23/48* (2006.01)
(Continued)

(52) U.S. Cl.
CPC .... *H01L 31/0203* (2013.01); *H01L 23/49861* (2013.01); *H01L 31/18* (2013.01);
(Continued)

(58) Field of Classification Search
USPC .............................. 257/81, 95, 98–100, 676
See application file for complete search history.

(56) References Cited

U.S. PATENT DOCUMENTS 7,102,209 B1 9/2006 Bayan et al.
7,344,920 B1 3/2008 Kirloskar et al.
(Continued)

FOREIGN PATENT DOCUMENTS

CN 1251943 A 5/2000
CN 1705091 A 12/2005
(Continued)

OTHER PUBLICATIONS

Anonymous: "Leiterplatte" Wikipedia, die Freie Enzyklopädie (online), Apr. 16, 2008. http://de.wikipedia.org/wiki/Leiterplatte. Retrieved from the internet: URL: http://dewikipedia.org/w/index.php?title=Leitherplatte&oldid=44965548. Entire document with English translation.
(Continued)

Primary Examiner — Raj R Gupta
(74) Attorney, Agent, or Firm — DLA Piper LLP (US)

(57) ABSTRACT

An optoelectronic component including a connection carrier comprising a structured carrier strip in which interspaces are filled with an electrically insulating material and an optoelectronic semiconductor chip attached and electrically connected to a top portion of the connection carrier, wherein the electrically insulating material terminates substantially flush with the carrier strip in places or the carrier strip projects beyond the electrically insulating material, and the carrier strip is not covered by the electrically insulating material on the top portion and/or on a bottom portion of the connection carrier.

13 Claims, 2 Drawing Sheets

(51) Int. Cl.

| | | |
|---|---|---|
| *H01L 31/0203* | (2014.01) | |
| *H01L 23/498* | (2006.01) | |
| *H01L 31/18* | (2006.01) | |
| *H01L 33/48* | (2010.01) | |
| *H01L 23/00* | (2006.01) | |
| *H01L 31/0232* | (2014.01) | |
| *H01L 33/62* | (2010.01) | |

(52) U.S. Cl.
CPC ............ *H01L 33/486* (2013.01); *H01L 24/48* (2013.01); *H01L 24/97* (2013.01); *H01L 31/0232* (2013.01); *H01L 33/62* (2013.01); *H01L 2224/48091* (2013.01); *H01L 2224/48247* (2013.01); *H01L 2224/97* (2013.01); *H01L 2924/00014* (2013.01); *H01L 2924/01046* (2013.01); *H01L 2924/01057* (2013.01); *H01L 2924/01068* (2013.01); *H01L 2924/01078* (2013.01); *H01L 2924/01079* (2013.01); *H01L 2924/09701* (2013.01); *H01L 2924/12041* (2013.01); *H01L 2924/12043* (2013.01); *H01L 2924/181* (2013.01); *H01L 2924/1815* (2013.01); *H01L 2933/0066* (2013.01)

(56) References Cited

U.S. PATENT DOCUMENTS

| 7,666,715 | B2 | 2/2010 | Brunner et al. | |
|---|---|---|---|---|
| 2002/0093026 | A1 | 7/2002 | Huang | |
| 2003/0151135 | A1* | 8/2003 | Sakamoto et al. | 257/723 |
| 2003/0168720 | A1 | 9/2003 | Kamada | |
| 2005/0017330 | A1* | 1/2005 | Diot et al. | 257/666 |
| 2005/0151142 | A1 | 7/2005 | Imai | |
| 2005/0167794 | A1 | 8/2005 | Kloen et al. | |
| 2005/0280016 | A1* | 12/2005 | Mok et al. | 257/99 |
| 2006/0254712 | A1* | 11/2006 | Soliz et al. | 156/307.3 |
| 2007/0029570 | A1* | 2/2007 | Shin et al. | 257/99 |
| 2007/0126093 | A1* | 6/2007 | Ho et al. | 257/675 |
| 2007/0126356 | A1* | 6/2007 | Tanda et al. | 313/512 |
| 2008/0304261 | A1* | 12/2008 | Van De Ven et al. | 362/231 |

FOREIGN PATENT DOCUMENTS

| DE | 3527496 | 3/1986 |
|---|---|---|
| DE | 20 2004 005228 U1 | 5/2005 |
| JP | 2006-80141 | 3/2006 |
| JP | 2007-157940 | 6/2007 |
| JP | 2007-197627 | 8/2007 |
| JP | 2007-288198 | 11/2007 |
| KR | 10-2004-0101423 | 12/2004 |
| WO | 2007/145237 A1 | 12/2007 |

OTHER PUBLICATIONS

European Examination Report dated Jan. 20, 2014 for European Application No. 09 753 505.8.
Notice of Allowance issued on Feb. 4, 2014 in corresponding Japanese Patent Application No. 2011-504309.
English translation of a Korean Office Action dated Jul. 29, 2015 of corresponding Korean Application No. 10-2010-7019998.

* cited by examiner

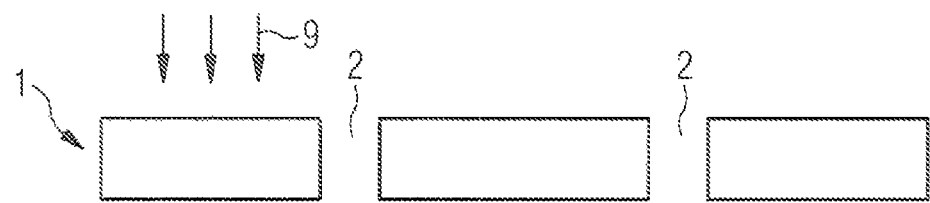
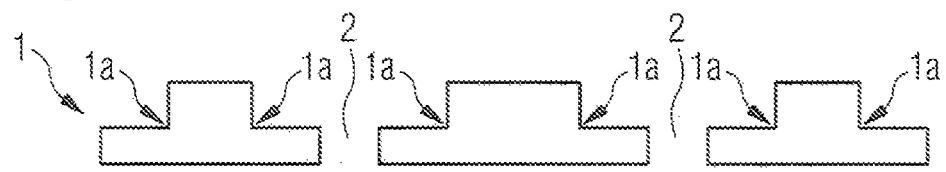
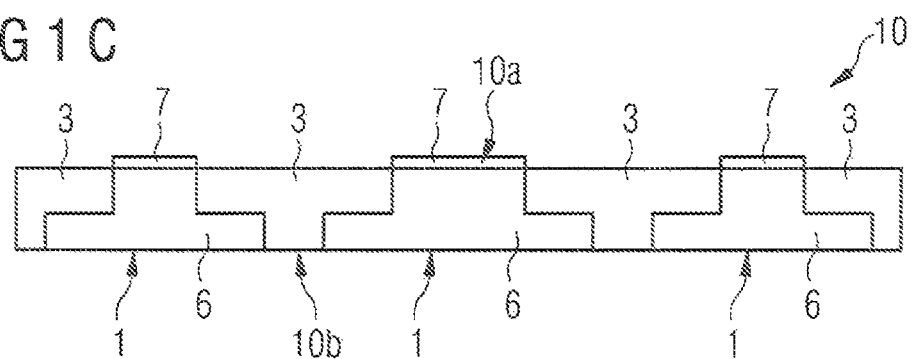
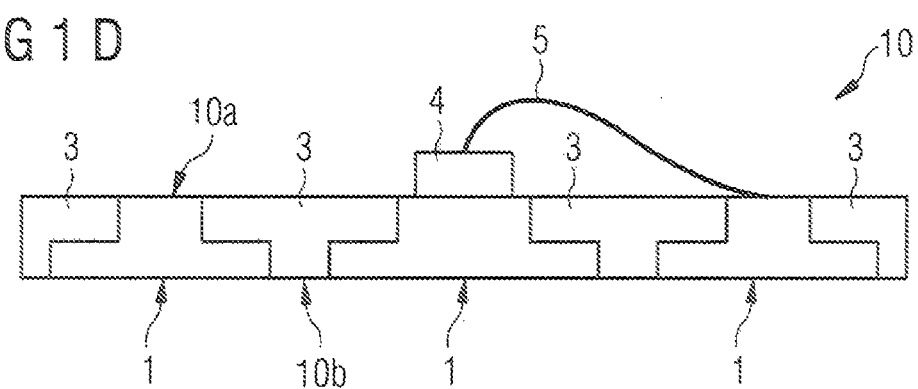

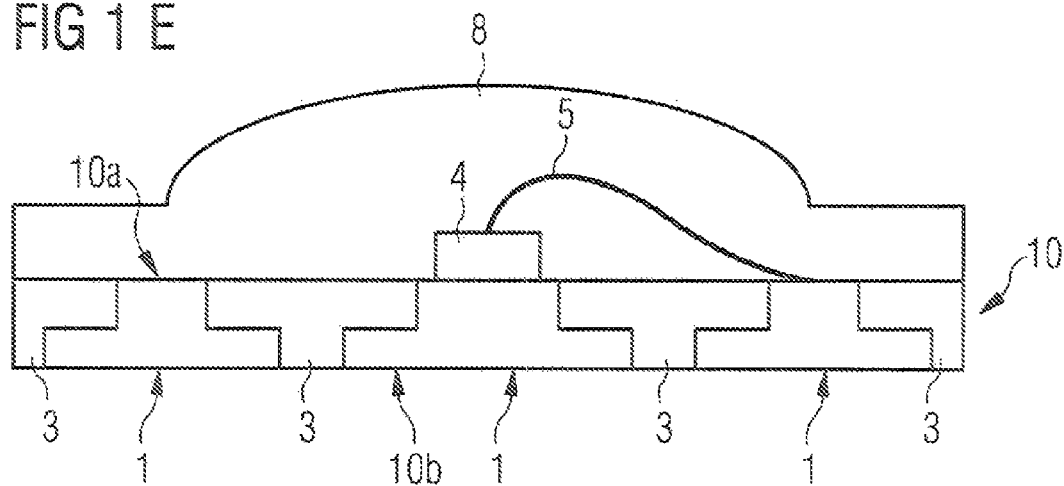
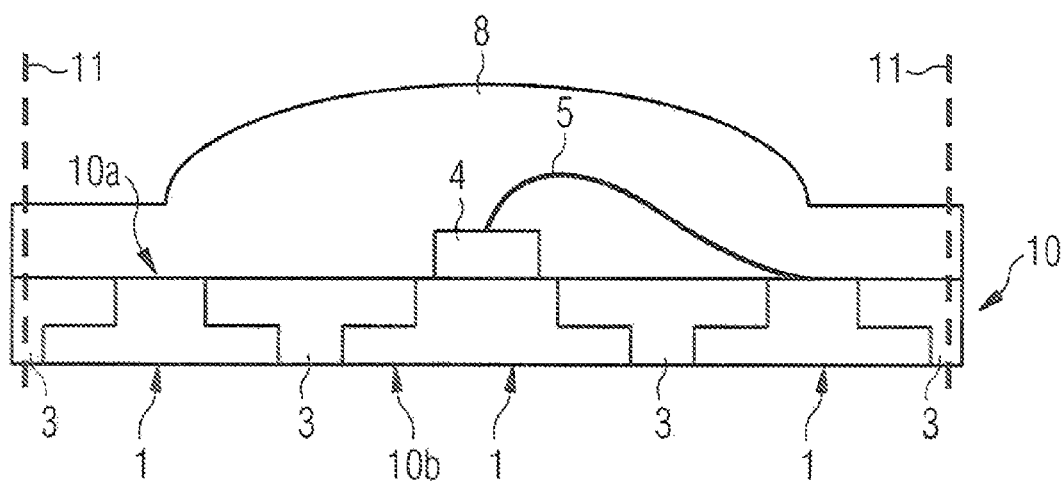

OPTOELECTRONIC COMPONENT AND METHOD FOR PRODUCING AN OPTOELECTRONIC COMPONENT

RELATED APPLICATIONS

This is a §371 of International Application No. PCT/DE2009/000438, with an international filing date of Mar. 31, 2009, which is based on German Patent Application Nos. 102008019269.4, filed Apr. 17, 2008, and 102008024704.9 filed May 21, 2008, the subject matter of which is incorporated by reference.

TECHNICAL FIELD

This disclosure relates to optoelectronic components and a method of producing such optoelectronic components.

BACKGROUND

There is a need to provide an optoelectronic component which is inexpensive to produce. There is a further need to provide a method of producing such an optoelectronic component.

SUMMARY

We provide an optoelectronic component comprising a connection carrier comprising a structured carrier strip in which interspaces are filled with an electrically insulating material and an optoelectronic semiconductor chip which is attached and electrically connected to a top portion of the connection carrier, wherein the electrically insulating material terminates substantially flush with the carrier strip in places or the carrier strip projects beyond the electrically insulating material, and the carrier strip is not covered by the electrically insulating material on the top portion and/or on a bottom portion of the connection carrier.

We also provide a method for producing an optoelectronic component, comprising: providing a carrier strip, etching the carrier strip, filling interspaces of the carrier strip with an electrically insulating material by screen printing to form a connection carrier, and applying a plurality of optoelectronic semiconductor chips to the carrier strip.

BRIEF DESCRIPTION OF THE DRAWINGS

FIG. 1A schematically shows an unstructured carrier strip.

FIG. 1B schematically shows a structured carrier strip.

FIG. 1C schematically shows the structured carrier strip of FIG. 1B and an insulating material.

FIG. 1D schematically shows the structured carrier strip of FIG. 1C with optoelectronic semiconductor chips applied.

FIG. 1E schematically shows a potting body applied to the carrier strip of FIG. 1D.

FIG. 1F schematically shows a singulated carrier strip of FIG. 1E.

DETAILED DESCRIPTION

The optoelectronic component may comprise a connection carrier. A connection carrier is understood to be a carrier for component parts of the optoelectronic component to which the component parts are mechanically attached and optionally electrically connected.

The connection carrier comprises a carrier strip. A carrier strip is understood to be a lead frame which consists of an electrically conductive material or contains at least one electrically conductive material. The carrier strip comprises interspaces, for example, between metallic bracing elements or webs and a metallic frame.

The carrier strip is structured, i.e., the bracing elements of the carrier strip are, for example, provided with structures. Structuring may proceed by an etching process.

In the connection carrier, the interspaces of the structured carrier strip are filled with an electrically insulating material. The carrier strip is preferably structured such that adhesion between the electrically insulating material and the carrier strip is improved as a result of the structuring of the carrier strip compared with an unstructured carrier strip.

The latter may thus comprise a connection carrier which comprises a structured carrier strip in which interspaces of the carrier strip are filled with an electrically insulating material. The optoelectronic component is based inter alia on the knowledge that filling of interspaces of the carrier strip may lead to mechanical reinforcement or strengthening of the carrier strip. A particularly inexpensive and mechanically stable connection carrier is thus obtained by the electrically insulating material in the interspaces of the carrier strip.

In other words, the electrically insulating material forms a matrix in which the structured carrier strip is incorporated. The structured carrier strip is embedded in the matrix of the electrically insulating material in such a way that, preferably, parts of the carrier strip remain uncovered by the electrically insulating material and other parts of the structured carrier strip are wetted with the material. Where the electrically insulating material wets the structured carrier strip, the carrier strip and material enter into an intimate mechanical connection with one another. This mechanical connection is preferably stable to temperatures of at least 130° C. in continuous operation such that the electrically insulating material does not become detached from the structured carrier strip even when the connection carrier consisting of structured carrier strip and electrically insulating material is heated. In the short term, for example, during soldering, the connection is stable at temperatures of up to 260° C.

The optoelectronic component may comprise at least one optoelectronic semiconductor chip. The optoelectronic semiconductor chip may, for example, comprise a luminescent diode chip. The luminescent diode chip may be formed by a laser diode chip or a light-emitting diode chip. In addition, it is possible for the optoelectronic semiconductor chip to be a detector chip such as, for example, a photodiode chip. The optoelectronic semiconductor chip is preferably attached and electrically connected to the top of the connection carrier. The optoelectronic semiconductor chip may be mounted at a point of the structured carrier strip which is not covered by the electrically insulating material.

The latter may comprise a connection carrier with a structured carrier strip in which interspaces are filled with an electrically insulating material. Furthermore, the optoelectronic component comprises an optoelectronic semiconductor chip which is attached and electrically connected to the top of the connection carrier.

Due inter alia to the above-described connection carrier, which consists of a small number of component parts and may be produced in a small number of method steps, the optoelectronic component is distinguished by being particularly simple and thus inexpensive to produce.

The carrier strip may comprise at least one anchoring structure. This means that at least one anchoring structure is structured into the carrier strip. Structuring preferably proceeds using an etching process. In this process, half-etched areas may be produced, which serve as anchoring points for anchoring the carrier strip to the electrically insulating material.

The carrier strip may, for example, comprise a T-shaped and/or a mushroom-shaped cross-section in places. Such cross-sections are distinguished by undercuts which form anchoring structures for the electrically insulating material.

It is additionally possible for hole structures to be located in the carrier strip in which electrically insulating material is located. These hole structures, for example, openings in the carrier strip, enlarge the surface area of the carrier strip and form anchoring structures for the electrically insulating material.

This means that the anchoring structures act against detachment of the electrically insulating material. As a result of the structuring of the carrier strip, the surface area thereof is enlarged relative to an unstructured carrier strip. This means that for the electrically insulating material a larger surface area is available over which it may adhere to the carrier strip. For this reason too, a structured carrier strip increases adhesion of the electrically insulating material compared with an unstructured carrier strip.

The electrically insulating material may terminate flush with the carrier strip at least in places. Preferably, the electrically insulating material on the top and/or on the bottom opposite the top of the carrier strip terminates flush with the carrier strip. It is additionally possible for the carrier strip to project beyond the electrically insulating material at the top and/or the bottom of the connection carrier. Preferably, the carrier strip is thus not covered by the electrically insulating material at the top and/or the bottom, preferably at the top and the bottom of the connection carrier. In other words, this means that the carrier strip is freely accessible at the top and/or the bottom of the connection carrier. Component parts of the optoelectronic component such as, for example, the optoelectronic semiconductor chip may then be attached to the carrier strip.

The electrically insulating material may contain or consist of at least one of the following materials: epoxy resin, silicone. The electrically insulating material may then consist, for example, of epoxy resin, it may consist of silicone, or it may consist of a hybrid material, of epoxy and silicone. The hybrid material is preferably a silicone-epoxy resin hybrid material with an epoxy resin content of between 30 and 70 wt. %. If the electrically insulating material consists of silicone, it preferably comprises an adhesion promoter, which improves adhesion to the carrier strip.

Apart from the stated materials, other electrically insulating, thermally resistant, solder-stable materials are also feasible for use as or in the electrically insulating material. The stated materials, in particular, epoxy resin and silicone-epoxy resin hybrid material, are distinguished by particularly good adhesion to the carrier strip.

The electrically insulating material may contain filler particles which reduce the coefficient of thermal expansion of the connection carrier. The filler particles may be particles of a material which comprises a low coefficient of thermal expansion. For example, the filler particles may be glass particles, ceramic particles and/or metallic particles.

The electrically insulating material may contain an adhesion promoter which increases adhesion to the carrier strip. This means that the electrically insulating material with the adhesion promoter displays improved mechanical adhesion to the carrier strip compared with an electrically insulating material without such an adhesion promoter.

The carrier strip may comprise a main body which contains copper or consists of copper. This means that the mechanically load-bearing component parts of the carrier strip consist of or contain copper. The main body may be covered in places with a layer which contains at least one of the following metals: silver, nickel, platinum, gold, palladium. For example, at the top of the connection carrier, where component parts of the optoelectronic component are preferably attached, the carrier strip may contain a layer which improves solderability. This layer may consist of silver, for example. It is also possible for the layer to comprise a layer sequence of nickel and gold, wherein the nickel adjoins the main body of the carrier strip and the gold lies on the side of the nickel layer remote from the carrier strip. In this case, a palladium layer may also be arranged between the nickel layer and the gold layer. Such layer sequences are distinguished on the one hand by good bondability, on the other hand by high mechanical stability, in particular high stability against scratching.

In a particularly simply producible optoelectronic component, the main body of the structured carrier strip may be completely coated with one of the stated layers after structuring. In that case, the adhesion promoter in the electrically insulating material may be selected such that it improves adhesion to the outer material of the layer.

The connection carrier may be cavity-free. This means that no recess or cavity or opening is provided in the connection carrier in which component parts of the optoelectronic component are intended to be arranged. Instead, the connection carrier is of substantially planar construction. "Substantially planar" means that at least the top and/or bottom of the connection carrier are planar within the bounds of manufacturing tolerance. Thereby, however, parts of the carrier strip may project beyond the plane formed by the electrically insulating material. The connection carrier may, for example, be cuboidal in form.

The optoelectronic semiconductor chip may be surrounded by a potting body which contains a silicone, wherein the potting body directly adjoins the electrically insulating material of the connection carrier in places. Enveloping of the optoelectronic semiconductor chip with the silicone may proceed, for example, in a process in which a liquid silicone is processed. For example, methods such as compression molding, liquid transfer molding or liquid injection molding are used. Casting or processing of an already partially cured silicone is also possible. In addition, the potting body may be applied by a "liquid silicone rubber process" to the connection carrier with the optoelectronic semiconductor chip. Enveloping with the potting body may proceed in closed or open molds by single- or multi-component liquid material processing. In the stated methods, the connection carrier may form part of the potting mold.

The potting body may in places also comprise a lens shape. For example, at least part of the outer surface of the potting body may form a refractive or diffractive optical system. The potting body is to this end curved in places in the manner of a lens.

The potting body may consist of silicone or of a silicone-epoxy hybrid material such as is also used for the electrically insulating material in the interspaces of the carrier strip.

Furthermore it is possible for the silicone-epoxy hybrid material to be processed as a tablet-shaped material using transfer molding or indeed as a granular material using compression molding or transfer molding.

The optoelectronic component described herein makes use inter alia of the knowledge that silicone adheres particularly well to an electrically insulating material such as silicone or a silicone-epoxy hybrid material. This means that it is possible through use of a suitable electrically insulating material in the connection carrier to provide a component in which particularly good mechanical adhesion exists between a potting body for the optoelectronic semiconductor chip and the connection carrier. This constitutes a major advantage of the optoelectronic component over components in which the connection carrier is formed, for example, of a ceramic material.

In particular, it is possible for the potting body and the electrically insulating material in the interspaces of the carrier strip to consist of the same material. In this respect, it is possible for the electrically insulating material to contain admixtures such as particles which absorb or reflect electromagnetic radiation.

The potting body and the electrically insulating material may, however, also consist of different materials. In this way, it is possible in each case to select a material which is particularly well suited to the respective use.

Alternatively or in addition to a potting body, the optoelectronic semiconductor chip may be covered with a glass window through mounting of a glass lens or the like. A combination of enveloping by converter-filled silicone or multi-molding, i.e. alternate application of clear silicone and converter-filled silicone (or vice versa), is also feasible. A dispensed lens is also possible, as a result of etched-in stop edges or adhesively bonded or otherwise applied stop edges on the top of the connection carrier.

A method of producing an optoelectronic component is additionally provided. The method may comprise the following steps:
  providing a carrier strip,
  structuring the carrier strip by an etching method,
  filling interspaces of the carrier strip with an electrically insulating material by a screen printing method to form a connection carrier, and
  applying a plurality of optoelectronic semiconductor chips to the carrier strip.

This means that the electrically insulating material may be introduced into the interspaces of the carrier strip by a screen printing method. In that case, the mask for the screen printing method may advantageously be selected in that bracing elements of the carrier strip, which are not to be covered by the electrically insulating material on the top or bottom thereof, are left free as a result of the mask. This means that the electrically insulating material is introduced purposefully only into the interspaces. For example, the top of the carrier strip remains uncovered such that no subsequent structuring of the electrically insulating material has to be performed. In this way, it is in particular also possible to produce a connection carrier in which at the top and/or bottom of the carrier strip the electrically insulating material terminates flush therewith. In addition, the material may be introduced in a metered manner into the interspaces in such a way that the carrier strip projects beyond the electrically insulating material at the top and/or bottom of the connection carrier.

A plurality of optoelectronic semiconductor chips may be applied to the carrier strip. In a subsequent method step the arrangement of carrier strip and semiconductor chips may then be singulated such that an optoelectronic component is produced which comprises at least one optoelectronic semiconductor chip.

An optoelectronic component such as is indicated in at least one of the above-described examples may be produced by the method. This means that the features indicated in relation to the optoelectronic component are also disclosed in combination with the above-described method.

The optoelectronic semiconductor chips may be enveloped after application to the connection carrier with a potting material to form a potting body and the arrangement of connection carrier, optoelectronic semiconductor chip and potting body is singulated to yield optoelectronic components, wherein singulation takes place through the potting body. The potting body consists in this case of one of the above-described materials and is produced by the above-described methods. The potting body is applied, for example, in such a way to the connection carrier that it covers a majority of or the entire top of the connection carrier. The potting body is in this way in direct contact with the electrically insulating material of the connection carrier, i.e., the potting body and the electrically insulating material of the connection carrier touch one another. Singulation is performed, for example, by sawing, laser separation, breaking or other singulation processes. In particular, the singulation process may proceed through the potting body such that the potting body and connection carrier are severed during singulation. The optoelectronic component produced in this way therefore comprises singulation traces at least on side faces which are detectable on the connection carrier and on the potting body. The potting body thus comprises singulation traces. The connection carrier likewise comprises singulation traces.

The optoelectronic component described herein and in particular also the connection carrier described herein are distinguished inter alia by the following advantages:

The connection carrier comprises a continuous, reinforced substrate. Because of the electrically insulating material in the interspaces of the carrier strip, unlike with a conventional unreinforced carrier strip, it is not necessary to cover the bottom of the carrier strip with a "backside tape". Contamination of the bottom of the connection carrier, where, for example, connection points for the optoelectronic component are located, may be avoided by the selected method of introducing the electrically insulating material into the interspaces.

In addition, the optoelectronic component is distinguished by a particularly inexpensive production method since inexpensive materials, such as carrier strips and the electrically insulating material, are used. In addition, the electrically insulating material and thus the entire connection carrier may be adapted to the requirements of the potting body with which the optoelectronic semiconductor chip may be potted. In this way, an optoelectronic component is obtained which is mechanically particularly stable since the risk of detachment between the potting body and connection carrier is greatly reduced. This means that, by suitably selecting the electrically insulating filling material, good adhesion to the subsequent potting, which may consist of the same or a similar material, may be achieved. The proportion of the area occupied by the carrier strip at the top of the connection carrier is kept as small as possible such that the potting body comprises a particularly large bonding area with the electrically insulating material of the connection carrier.

Advantageously, use of the electrically insulating material in the interspaces of the carrier strip means that the potting body does not have to assume any or barely any mechanical function for reinforcing the connection carrier. Reinforcement, i.e., mechanical stabilization of the connection carrier proceeds substantially by way of the electrically insulating material.

In addition, the electrically insulating materials used to fill the interspaces of the carrier strip may be adapted to the requirements of the optoelectronic component by the adhesion promoter with regard to their adhesion to the carrier strip or by introduction of filler particles with regard to their coefficient of thermal expansion. It is also possible to pretreat the carrier strip to improve adhesion or selectively not to coat it or to coat it other than required for, for example, soldering. The surface of the carrier strip may, for example, be roughened which further improves adhesion to the electrically insulating material.

The thickness of the connection carrier may also be appropriately selected depending on the desired use of the optoelectronic component.

If, for example, copper or another material displaying good thermal conduction is used for the main body of the carrier strip, the connection carrier is also distinguished by a good thermal conductance value which lies in the range of the conductance value of the material of which the main body of the carrier strip consists. This means that the thermal resistance of the connection carrier is greatly reduced relative to other, for example, ceramic connection carriers.

The optoelectronic component described herein is suitable for example for use in general lighting or indeed in backlighting of LCD panels, in LCD screens or TV sets.

The optoelectronic component described herein and the method described herein are explained in greater detail below with reference to examples and the associated figures.

Method steps for an example of a method described herein are explained in greater detail with reference to schematic sectional representations in conjunction with FIGS. 1A, 1B, 1C, 1D, 1E, and 1F.

FIG. 1F shows by way of a schematic sectional representation an example of an optoelectronic component described herein.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

With reference to FIG. 1A, a first method step of a method described herein for producing an optoelectronic component is explained in greater detail in a schematic sectional representation. FIG. 1A shows a sectional representation of a carrier strip 1. The carrier strip 1 of FIG. 1A is as yet unstructured. It comprises interspaces 2, which are arranged between bracing elements of the carrier strip 1. The carrier strip 1 is structured by an etching method, indicated by the arrows 9.

FIG. 1B shows the carrier strip 1 structured in this way. The carrier strip 1 is half-etched. The carrier strip 1 comprises anchoring structures 1a. In this example, the carrier strip 1 to this end comprises a T-shaped cross-section. However, it is also possible for the carrier strip 1 to comprise, for example, a mushroom-shaped cross section. In both cases the anchoring structures 1a are formed by undercuts, which improve adhesion of an electrically insulating material to be subsequently applied. In addition, structuring of the lead frame 1 enlarges the surface area thereof, so further improving adhesion to a material to be applied subsequently.

A further method step is described with reference to FIG. 1C. In that method step, an electrically insulating material 3 is introduced into the interspaces 2 of the carrier strip 1. The electrically insulating material 3 comprises, for example, silicone or a silicone-epoxy hybrid material. The insulating material 3 is preferably introduced into the interspaces 2 by screen printing in such a way that the connection carrier 10 formed comprises zones on its top 10a and its bottom 10b in which the carrier strip 1 is freely accessible. This means that the carrier strip 1 remains uncovered by the electrically insulating material 3 at the top 10a and bottom 10b of the connection carrier 10. The carrier strip 1 may also be cleaned of electrically insulating material 3 at the top 10a and bottom 10b of the connection carrier 10, for example, using a plasma method.

FIG. 1C further shows that the carrier strip 1 may comprise a main body 6 and a coating 7. The main body 6 may, for example, contain copper or consist of copper. The layer 7 may contain at least one of the following metals: silver, nickel, platinum, gold, palladium. The layer 7 may consist of, for example, silver. It is also possible for the layer 7 to comprise a layer sequence of nickel and gold, wherein the nickel adjoins the main body 9 of the carrier strip 1 and the gold lies on the side of the nickel layer remote from the carrier strip 1. In that case, a palladium layer may also be arranged between the nickel layer and the gold layer.

The main body 6 may be covered by the layer 7 on all sides. However, it is also possible for the layer 7 to be present only on the top 10a of the connection carrier 10. The layer 7 may be applied to the main body 6 before or after introduction of the electrically insulating material 3 into the interspaces 2 of the carrier strip 1. For reasons of clarity the layer 7 is not shown any more in the following figures.

After introduction of the electrically insulating material 3 into the interspaces 2, the electrically insulating material 3 is cured. Then the top 10a and/or the bottom 10b of the connection carrier 10 can be chemically or mechanically cleaned where the carrier strip 1 is located. The carrier strip 1 may terminate at top 10a and bottom 10b flush with the electrically insulating material 3. Component parts of the optoelectronic component are then attached to the top 10a. The connection points of the component may be located on the bottom 10b. This means that the component may in this way be mounted using surface mount technology.

A further method step is explained in greater detail in conjunction with FIG. 1D. In that method step, a plurality of optoelectronic semiconductor chips 4 are applied to the connection carrier 10. The optoelectronic semiconductor chip is to this end soldered or adhesively bonded to an exposed zone on the top 10a of the connection carrier 10 and connected by a wire contact 5 to a further web or a bracing element of the lead frame 1. In this respect, FIG. 1D shows just a single optoelectronic semiconductor chip 4, since FIG. 1D shows just a small portion of the connection carrier 10.

The optoelectronic semiconductor chip comprises, for example, a light-emitting diode chip. It may, for example, comprise a light-emitting diode of thin-film structure. Light-emitting diodes of thin-film structure emit a predominant proportion of the radiation produced at the top thereof remote from the connection carrier such that a reflector for laterally emerging radiation may be dispensed with.

In addition, further component parts may be applied to the connection carrier 10 such as, for example, ESD protection components, temperature sensors, brightness sensors, memory means with component information and the like.

With reference to FIG. 1E, a subsequent method step is explained in greater detail in which a potting body 8 is applied by one of the above-described methods to the connection carrier 10 in such a way that the optoelectronic semiconductor chip is completely surrounded by the potting body 8. The potting body 8 comprises a particularly large contact area with regard to the electrically insulating material 3 such that good adhesion arises between the electrically insulating material 3 and the potting body 8. The potting body 8 consists of one of the following materials, for example: silicone, silicone-epoxy resin hybrid material.

The carrier strip 1 is preferably structured such that the carrier strip has a smaller cross-sectional area at the top 10a of the connection carrier 10 than at the bottom 10b of the connection carrier 10. This has the advantage that the electrically insulating material 3 occupies a particularly large proportion of the area at the top 10a, where there is a connection with the potting body 8. This improves adhesion of the potting body 8 to the connection carrier 10. At the bottom on the other hand, the heat-conducting material of the carrier strip 1 occupies the majority of the area. In this way, heat generated when an optoelectronic semiconductor chip is in operation may be dissipated particularly well to the surroundings of the optoelectronic component.

A final method step is explained with reference to FIG. 1F. In that method step, the arrangement of carrier strip 10 and potting body 8 is singulated along the section lines 11. Singulation may proceed, for example, by one of the following methods: sawing, laser separation, breaking. During singulation, singulation traces are produced both on the connection carrier 10 and on the potting body 8. Singulation is thus detectable on the finished optoelectronic component.

The description made with reference to examples does not restrict this disclosure to those examples. Rather, the disclosure encompasses any novel feature and any combination of features including, in particular, any combination of features in the appended claims, even if this feature or this combination is not itself explicitly indicated in the claims or examples. For example, the connection carrier described herein and the method of producing the connection carrier reveal a structure which is independent of the use of optoelectronic semiconductor chips.

The invention claimed is:

1. An optoelectronic component comprising:
a cavity-free connection carrier comprising a structured carrier strip in which interspaces are filled with an electrically insulating material, and
an optoelectronic semiconductor chip attached and electrically connected to a top portion of the connection carrier, wherein
the electrically insulating material terminates substantially flush with the carrier strip in places or the carrier strip projects beyond the electrically insulating material,
the carrier strip is not covered by the electrically insulating material on the top portion and on a bottom portion of the connection carrier,
the carrier strip is a lead frame which consists of an electrically conductive material,
the entire connection carrier is planar on its top and bottom sides, and
the carrier strip has a smaller cross-sectional area at the top portion of the connection carrier than at the bottom portion of the connection carrier.

2. The optoelectronic component according to claim 1, wherein the optoelectronic semiconductor chip is surrounded by a potting body containing silicone and in selected locations directly adjoins the electrically insulating material of the connection carrier, and the electrically insulating material contains a silicone or consists of a silicone.

3. The optoelectronic component according to claim 1, wherein the carrier strip comprises at least one anchoring structure in the form of undercuts, wherein the anchoring structure improves adhesion of the electrically insulating material to the carrier strip.

4. The optoelectronic component according to claim 1, wherein the carrier strip comprises a T-shaped cross section at least in selected locations.

5. The optoelectronic component according to claim 1, wherein the carrier strip comprises a mushroom-shaped cross section at least in selected locations.

6. The optoelectronic component according to claim 1, wherein the at least one anchoring structure is etched.

7. The optoelectronic component according to claim 1, wherein the at least one anchoring structure is an opening in the carrier strip.

8. The optoelectronic component according to claim 1, wherein the electrically insulating material contains at least one of or consists of epoxy resin and silicone.

9. The optoelectronic component according to claim 1, wherein the electrically insulating material contains filler particles which reduce the coefficient of thermal expansion of the connection carrier.

10. The optoelectronic component according to claim 1, wherein the electrically insulating material contains an adhesion promoter which increases adhesion to the carrier strip.

11. The optoelectronic component according to claim 1, wherein the carrier strip comprises a main body containing copper covered in selected locations with a layer containing at least one metal selected from the group consisting of silver, nickel, platinum, gold and palladium.

12. The optoelectronic component according to claim 1, wherein the carrier strip comprises side faces which run transversely or orthogonally with respect to the top portion and to the bottom portion of the connection carrier, the side faces being completely formed with the electrically insulating material.

13. An optoelectronic component comprising:
a cavity-free connection carrier comprising a structured carrier strip in which interspaces are filled with an electrically insulating material, and
an optoelectronic semiconductor chip attached and electrically connected to a top portion of the connection carrier, wherein
the electrically insulating material terminates substantially flush with the carrier strip in places or the carrier strip projects beyond the electrically insulating material,
the carrier strip is not covered by the electrically insulating material on the top portion and on a bottom portion of the connection carrier,
the carrier strip is a lead frame which consists of an electrically conductive material,
the entire connection carrier is planar on its top and bottom sides,
the carrier strip has a smaller cross-sectional area at the top portion of the connection carrier than at the bottom portion of the connection carrier,
the electrically insulating material contains a silicone, filler particles that reduce the coefficient of thermal expansion of the connection carrier and an adhesion promoter that increases adhesion of the insulating material to the carrier strip,
the optoelectronic semiconductor chip is surrounded by a potting body containing silicone,
the silicone of the electrically insulating material and the silicone of the potting body are in direct contact with each other,
the carrier strip comprises a main body that contains copper, and said main body is covered with a layer that contains at least one of silver, nickel, platinum, gold or palladium.

* * * * *